(12) United States Patent
Fujimoto et al.

(10) Patent No.: US 6,498,075 B1
(45) Date of Patent: Dec. 24, 2002

(54) DICING METHOD

(75) Inventors: Kouji Fujimoto, Tokyo (JP); Toshiyuki Tateishi, Tokyo (JP)

(73) Assignee: Disco Corporation, Tokyo (JP)

( * ) Notice: Subject to any disclaimer, the term of this patent is extended or adjusted under 35 U.S.C. 154(b) by 65 days.

(21) Appl. No.: 09/660,261

(22) Filed: Sep. 12, 2000

(30) Foreign Application Priority Data

Sep. 14, 1999 (JP) ............................................. 11-260333

(51) Int. Cl.$^7$ .......................... H01L 21/46; H01L 21/78; H01L 21/301
(52) U.S. Cl. ............................ 438/462; 438/33; 438/68; 438/113; 438/464
(58) Field of Search .................................. 438/460, 461, 438/462, 463, 464, 465, 468, 467, 113, 33, 68; 125/15

(56) References Cited

U.S. PATENT DOCUMENTS

| | | | |
|---|---|---|---|
| 4,787,362 A | * 11/1988 | Boucher et al. | ............... 125/15 |
| 6,107,163 A | * 8/2000 | Kojima et al. | ............... 438/460 |
| 6,119,675 A | * 9/2000 | Akram et al. | ............ 125/13.01 |
| 6,165,815 A | * 12/2000 | Ball | ........................... 438/113 |
| 6,174,788 B1 | * 1/2001 | Balamurugan | .............. 221/209 |

* cited by examiner

*Primary Examiner*—Olik Chaudhuri
*Assistant Examiner*—Timothy Sutton
(74) *Attorney, Agent, or Firm*—Smith, Gambrell & Russell, LLP

(57) ABSTRACT

The present invention is to provide a dicing method of cutting a workpiece along the first streets and the second streets by using a cutting blade having an annular cutting edge provided on the outer peripheral portion on one side surface of a base plate, the workpiece having plural first streets and second streets intersected each other at a predetermined angle. When the second streets are to be cut after the first streets are cut, the cutting blade is so positioned that the side of the base plate faces the side of the unworked region of the workpiece.

1 Claim, 7 Drawing Sheets

DICING METHOD

FIELD OF THE INVENTION

The present invention relates to a dicing method of cutting a workpiece into the form of a lattice by using a cutting blade having an annular cutting edge.

DESCRIPTION OF THE PRIOR ART

In the production of semiconductor devices, for example, a surface of a nearly disk-like semiconductor wafer is sectioned into plural rectangular regions by cutting lines called first streets and second streets that are arranged in the form of a lattice pattern, and a predetermined circuit pattern is formed on each of these rectangular regions. The plural rectangular regions on each of which the circuit pattern has been formed are cut into individual pieces to obtain so-called semiconductor chips. The cutting of the semiconductor wafer is usually carried out by using a precision cutting apparatus called dicing apparatus. The dicing apparatus is equipped with a cutting blade 54 that is shown in FIG. 5. The cutting blade 54 comprises a base plate (hub) 541 and an annular cutting edge 542 provided on an outer peripheral portion on one side surface of the base plate 541. The cutting blade 54 that is generally called hub blade is mounted being sandwiched between a flange portion 572 of a fixing flange 57 and a holding flange 58 by fitting the a plate 541 to a tool-mounting portion 571 of the fixing flange 57 attached on a rotary spindle 56 and then by screwing the holding flange 58 onto an end of the fixing flange 57. The workpiece is moved correlative to each other to the cutting blade 54 mounted on the rotary spindle 56 in a direction at right angles to the rotary shaft of the cutting blade 54 to execute the cutting.

The dicing method of cutting the semiconductor wafer into the form of a lattice pattern by the cutting blade 54 will now be described with reference to FIG. 7. In FIG. 7, reference numeral 11 denotes a semiconductor wafer which is the workpiece to be treated, and on the surface thereof are formed plural first streets 11a in parallel with each other and plural second streets 11b formed in parallel with each other in a direction at right angles to the first streets 11a.

Referring to FIG. 7(a), a semiconductor wafer 11 is so positioned that the first streets 11a are in a cut-feeding direction (that is a direction of moving a workpiece for cutting it) indicated by an arrow X and the cutting blade 54 is brought to a side edge of the semiconductor wafer 11. Here, the cutting blade 54 is set so that the side of the base plate 541 is on the side of an unworked region of the semiconductor wafer 11 which is the workpiece to be treated, i.e., that the side of the cutting edge 542 is located on the upstream side (upper side in FIG. 7) in an indexing direction indicated by an arrow Y1. Referring to FIG. 7(b), a forward cutting step is effected to cut the plural first streets 1a by sequentially and repetitively executing a cut-feeding for moving the semiconductor wafer 11 and the cutting blade 54 correlative to each other in a direction which is the cut-feeding direction indicated by an arrow X and an index-feeding for moving the cutting blade 54 in the indexing direction indicated by an arrow Y1 after one street is cut. After the forward cutting step has been finished, a rotational positioning step is executed to turn the semiconductor wafer 11 by 90 degrees as shown in FIG. 7(c), so that the second streets 1b are located in the cut-feeding direction indicated by an arrow X. At this moment, the cutting edge 542 of the cutting blade 54 is on the side of the unworked region of the semiconductor wafer 11 which is the workpiece, namely, the cutting edge 542 of the cutting blade 54 faces the downstream side (upper side in FIG. 7) in the indexing direction indicated by an arrow Y2. Then, referring to FIG. 7(d), the plural second streets 11b are cut by a return cutting step in which the cut-feeding for moving the semiconductor wafer 11 and the cutting blade correlative to each other in a direction which is the cut-feeding direction indicated by an arrow X and the index-feeding for moving the cutting blade 54 in the indexing direction indicated by the arrow Y2 after one street has been cut are executed sequentially and repetitively. According to the above-mentioned dicing method, a forward and return movement of the cutting blade 54 in the indexing direction (indicated by arrows Y1 and Y2) makes it possible to cut the semiconductor wafer 11 into the form of a lattice along the first streets 11a and the second streets 11b, whereby a very good productivity can be obtained.

In the above-mentioned dicing method, however, the cutting edge 542 of the cutting blade 54 undergoes great damage and becomes no longer usable before it is worn out. Therefore, the cutting blade must be frequently renewed, resulting in an increase of costs for the tools and for replacement.

SUMMARY OF THE INVENTION

The present inventors have conducted keen study in an effort to investigate the cause of damage to the cutting edge and have discovered the following fact. That is, though the semiconductor wafer is mounted on a frame via a tape, a pellet formed by the cutting in the forward cutting step may peel off the tape and fly when cutting of the wafer is performed by the cutting edge revolving at a speed as high as 20,000 to 30,000 rpm. The pellet 110 that peeled off may hit the outer peripheral edge 541a of the base plate 541 of the cutting blade 54 as shown in FIG. 6 to bite into the cutting edge 542 to damage the cutting edge 542. When the workpiece to be treated is a semiconductor wafer 11 of a disk-like shape, in particular, small and sharp triangular pellets are formed on the outer periphery by the dicing due to its disk-like shape. The sharp pellets 110 peel off easily because they are adhered at small contact areas on the tape 112, and bite into between the base plate 541 and the cutting edge 542 to damage the cutting edge 542.

Further, as a result of study by the present inventors, it was found that even when the pellets fly toward the side where the cutting edge 542 of the base plate 541 is provided and hit the cutting edge 542, the phenomenon shown in FIG. 6 does not occur since there is no base plate 541 and hence, the pellets that have flown do not bite into the cutting edge 542.

It is therefore an object of the present invention to provide a dicing method capable of preventing the cutting edge from being damaged by the flying pellets formed by the cutting.

In order to accomplish the above-mentioned object, according to the first invention, there is provided a dicing method of cutting a workpiece having plural first streets formed in parallel with each other and plural second streets formed in parallel with each other in a direction to intersect said first streets at a predetermined angle, along said first streets and said second streets by using a cutting blade having an annular cutting edge formed along the outer peripheral portion on one side surface of a base plate, wherein said dicing method comprises:

the first cutting step in which the plural first streets are cut by sequentially repeating the cut-feeding for positioning the workpiece so that the first streets are in the cut-feeding direction and for moving said workpiece and said cutting blade correlative to each other in the cut-feeding direction and the index-feeding for moving said workpiece and said cutting blade correlative to each other in an index direction at right angles to the cut-feeding direction to index the gap of said first streets;

a rotational positioning step in which after said first cutting step has been finished, said workpiece is turned by a predetermined angle to be positioned so that said second streets are in the cut-feeding direction, and said cutting blade is positioned at one side edge of said workpiece so that said base plate of said cutting blade faces the side of the unworked region of said workpiece; and the second cutting step in which after said rotational positioning step has been finished, the plural second streets are cut by sequentially repeating the cut-feeding for moving said workpiece and said cutting blade correlative to each other in the cut-feeding direction and the index-feeding for moving said workpiece and said cutting blade correlative to each other in the index direction at right angles to the cut-feeding direction to index the gap of said second streets.

Further, in order to accomplish the above-mentioned object, according to the second invention, there is provided a dicing method of cutting a semiconductor wafer mounted on a frame via a tape and having plural first streets formed in parallel with each other and plural second streets formed in parallel with each other in a direction to intersect said first streets at a predetermined angle, along said first streets and said second streets by using a cutting blade having an annular cutting edge formed along the outer peripheral portion on one side surface of a base plate, wherein said dicing method comprises:

the first cutting step in which the plural first streets are cut by sequentially repeating the cut-feeding for positioning the semiconductor wafer so that the first streets are in the cut-feeding direction and for moving said semiconductor wafer and said cutting blade correlative to each other in the cut-feeding direction and the index-feeding for moving said semiconductor wafer and said cutting blade correlative to each other in an index direction at right angles to the cut-feeding direction to index the gap of said first streets;

the first rotational positioning step in which after said first cutting step has been finished, said semiconductor wafer is turned by a predetermined angle to be positioned so that said second streets are in the cut-feeding direction and said cutting blade is positioned at one side edge of said semiconductor wafer so that the base plate of said cutting blade faces the side of the unworked region of said semiconductor wafer;

the second cutting step in which after said first rotational positioning step has been finished, the plural second streets are cut over a half region from the one side edge toward the center of said semiconductor wafer by sequentially repeating the cut-feeding for moving said semiconductor wafer and said cutting blade relatively in the cut-feeding direction and the index-feeding for moving said semiconductor wafer and said cutting blade relatively in the index direction at right angles to the cut-feeding direction to index the gap of said second streets;

the second rotational positioning step in which after said second cutting step has been finished, said semiconductor wafer is turned by 180 degrees and said cutting blade is positioned at the other side edge of said semiconductor wafer so that the base plate side of said cutting blade faces the side of the unworked region of said semiconductor wafer; and the third cutting step in which after said second rotational positioning step has been finished, he plural second streets are cut over the remaining half region from the other side edge toward the center of said semiconductor wafer by sequentially repeating the cut-feeding for moving said semiconductor wafer and said cutting blade relatively in the cut-feeding direction and the index-feeding for moving said semiconductor wafer and said cutting blade relatively in the index direction at right angles to the cut-feeding direction to index the gap of said second streets.

DETAILED DESCRIPTION OF THE PREFERRED EMBODIMENTS

The dicing method according to an embodiment of the present invention will now be described in detail with reference to the accompanying drawings.

Figure 1:
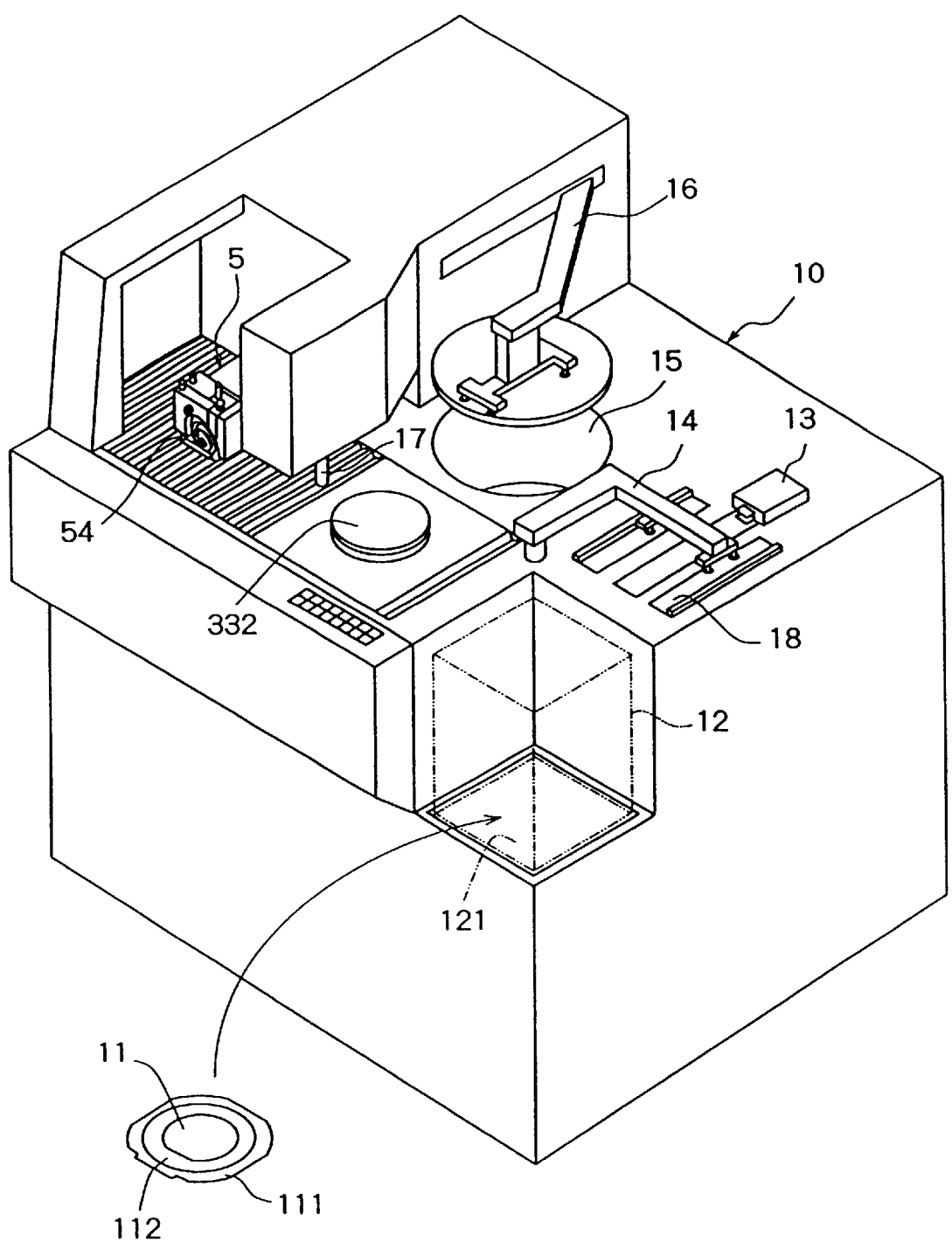
FIG. 1 is a perspective view of a dicing apparatus which is a cutting apparatus used for performing the dicing method of the present invention.

FIG. 1 is a perspective view of a dicing apparatus for performing the dicing method of the present invention.

Figure 2:
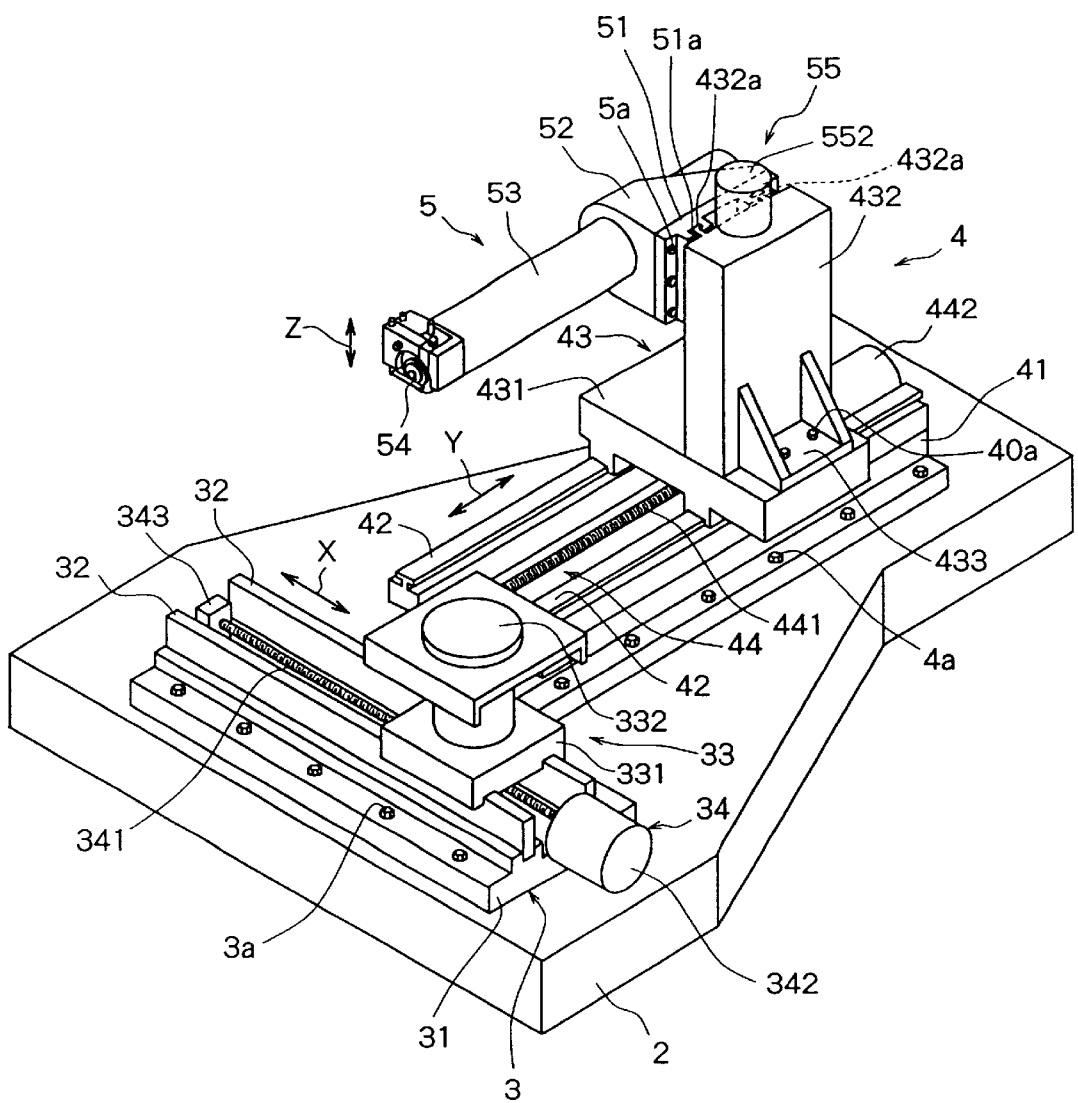
FIG. 2 is a perspective view illustrating major portions of the dicing apparatus shown in FIG. 1.

The dicing apparatus shown in FIG. 1 is equipped with a housing 10 of nearly a rectangular parallelepiped shape. As shown in FIG. 2, the housing 10 comprises a stationary base plate 2, a chuck table mechanism 3 disposed on the stationary base plate 2 to freely move in a direction indicated by an arrow X which is the cut-feeding direction and holds the workpiece, a spindle support mechanism 4 disposed on the stationary base plate 2 to freely move in a direction indicated by an arrow Y which is the indexing direction (direction perpendicular to the direction indicated by the arrow X which is the cut-feeding direction), and a spindle unit 5 disposed on the spindle support mechanism 4 to freely move in a direction indicated by an arrow Z which is the cutting-in direction.

The chuck table mechanism 3 includes a support plate 31 disposed on the stationary base plate 2 and secured thereto with plural mounting bolts 3a, two guide rails 32 and 32 arranged on the support plate 31 in parallel with each other in the direction indicated by the arrow X, and a chuck table 33 disposed on the guide rails 32 and 32 to freely move in a direction indicated by the arrow X. The chuck table 33 comprises an adsorption chuck support plate 331 movably disposed on the guide rails 32 and 32, and an adsorption chuck 332 mounted on the adsorption chuck support plate 331, and holds the workpiece such as a disk-like semiconductor wafer on the adsorption chuck 332 by a suction means that is not shown. The chuck table mechanism 3 includes a drive means 34 for moving the chuck table 33 along the two guide rails 32 and 32 in the direction indicated by the arrow X. The drive means 34 includes an externally threaded rod 341 disposed between the two guide rails 32 and 32 in parallel therewith, and a drive source such as a pulse motor 342 for rotatively driving the externally threaded rod 341. The externally threaded rod 341 is rotatably supported, at its one end, by a bearing block 343 that is secured to the support plate 31 and is transmission-coupled, at its other end, to the output shaft of the pulse motor 342 through a reduction gear that is not shown. The externally threaded rod 341 is screwed into an internally threaded through-hole formed in an internally threaded block (not shown) that protrudes from the lower surface at the center of the adsorption chuck support plate 331 that constitutes the chuck table 33. By driving the externally threaded rod 341 forward and reverse by the pulse motor 342, therefore, the chuck table 33 moves along the guide rails 32 and 32 in the direction indicated by the arrow X. The chuck table mechanism 3 further has a turning mechanism (not shown) for turning the chuck table 33.

The spindle support mechanism 4 includes a support plate 41 disposed on the stationary base plate 2 and secured thereto with plural mounting bolts 4a, two guide rails 42 and 42 arranged on the support plate 41 in parallel with each other in the direction indicated by the arrow Y, and a moving support plate 43 disposed on the guide rails 42 and 42 to freely move in a direction indicated by the arrow Y. The moving support plate 43 comprises a moving support portion 431 movably disposed on the guide rails 42 and 42, and a spindle-mounting portion 432 mounted on the moving support portion 431. A mounting bracket 433 is secured to the spindle-mounting portion 432. By fastening the mounting bracket 433 to the moving support portion 431 with plural mounting bolts 40a, the spindle-mounting portion 432 is mounted on the moving support portion 431. The spindle-mounting portion 432 further has two guide rails 432a, 432a extending in the direction indicated by the arrow Z on the surface opposite to the surface on which the mounting bracket 433 is mounted. The spindle support mechanism 4 includes a drive means 44 for moving the moving support plate 43 along the two guide rails 42, 42 in the direction indicated by the arrow Y. The drive means 44 includes an externally threaded rod 441 disposed between the two guide rails 42 and 42 in parallel therewith, and a drive source such as pulse motor 442 for rotatively driving the externally threaded rod 441. The externally threaded rod 441 is rotatably supported, at its one end, by a bearing block (not shown) that is secured to the support plate 41 and is transmission-coupled, at its other end, to the output shaft of the pulse motor 442 through a reduction gear that is not shown. The externally threaded rod 441 is screwed into an internally threaded through hole formed in an internally threaded block (not shown) that protrudes from the lower surface at the center of the moving support portion 431 constituting the moving support plate 43. By driving the externally threaded rod 441 forward and reverse by the pulse motor 442, therefore, the moving support plate 43 moves along the guide rails 42 and 42 in the direction indicated by the arrow Y.

Figure 5:
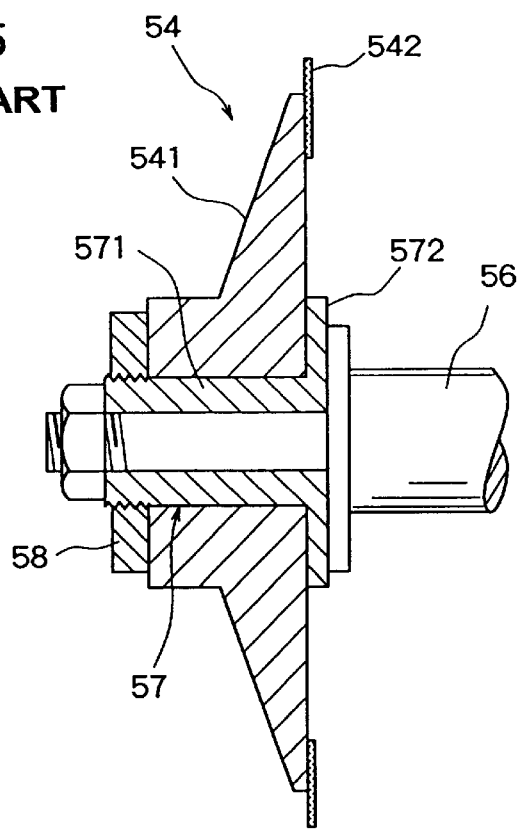
FIG. 5 is a sectional view illustrating a state where a cutting blade to be mounted on the dicing apparatus is attached onto a rotary spindle of a cutting blade.
Figure 6:
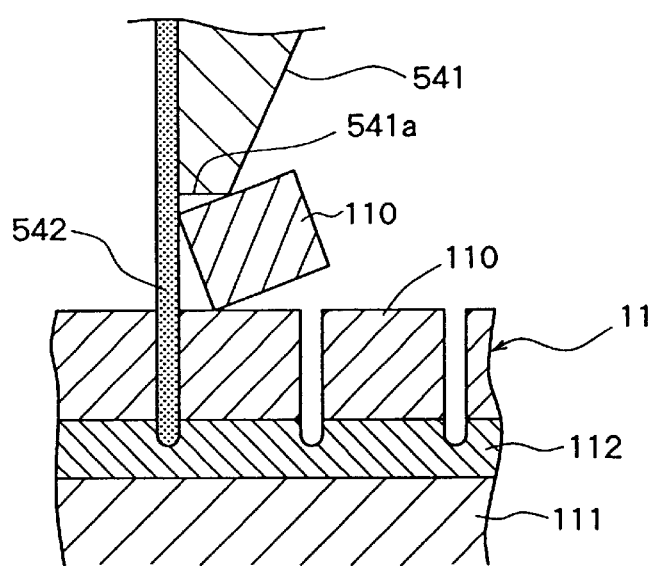
FIG. 6 is a sectional view illustrating, on an enlarged scale of major portions, a state where a semiconductor wafer is cut,by the cutting blade shown in FIG. 5.
Figure 7A:
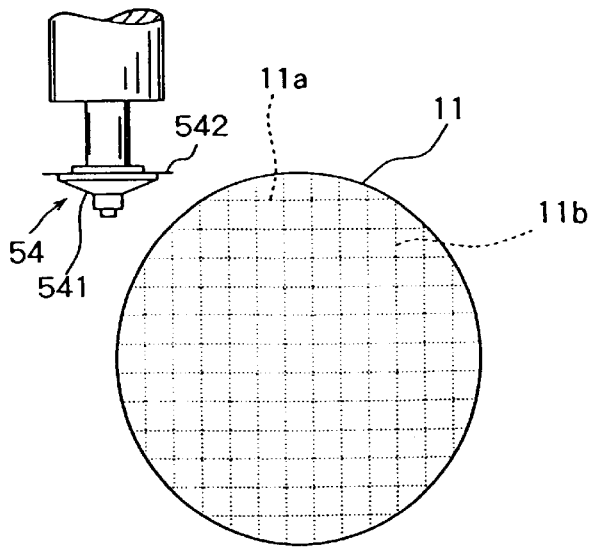
FIGS 7(a)–7(d) are views illustrating a conventional dicing method.
Figure 7B:
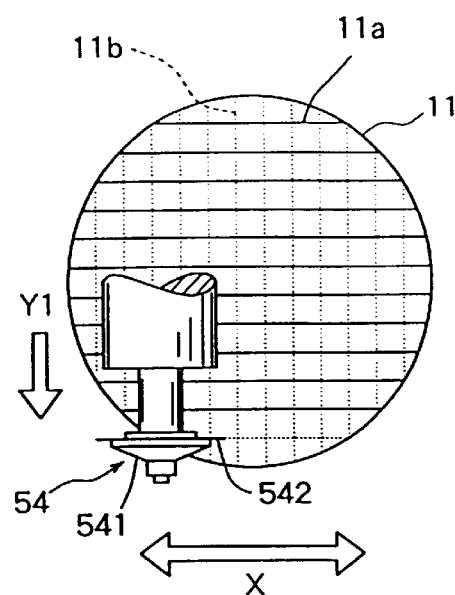
Figure 7C:
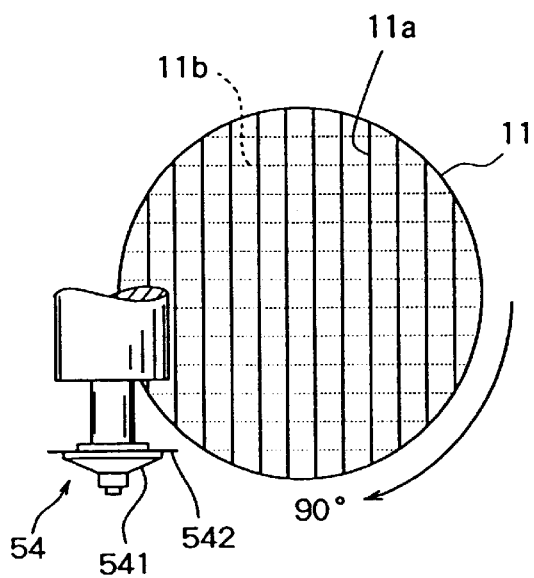
Figure 7D:
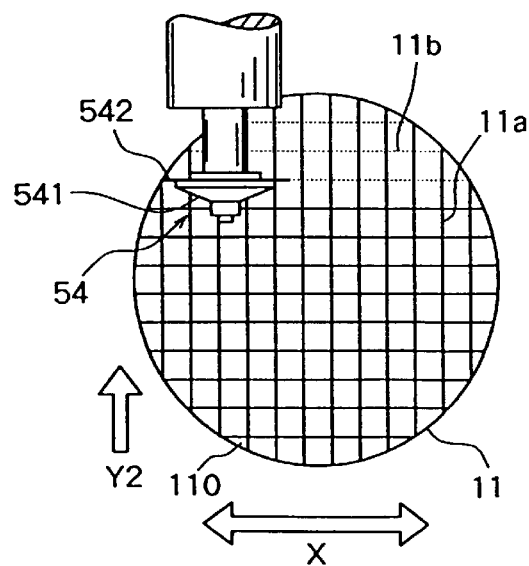

The spindle unit 5 includes a moving base plate 51, a spindle holder 52 secured to the moving base plate 51 with plural mounting bolts 5a, and a spindle housing 53 mounted on the spindle holder 52. The moving base plate 51 has two to-be-guided rails 51a and 51a that slidably fit to two guide rails 432a and 432a provided on the spindle-mounting portion 432 of the spindle support mechanism 4, and is so supported as to move in the direction indicated by the arrow Z by fitting the to-be-guided rails 51a and 51a to the guide rails 432a and 432a. A rotary spindle 56 mounting a cutting blade 54 shown in FIG. 5 is rotatably disposed within the spindle housing 53. The rotary spindle 56 is rotatively driven by a rotary drive mechanism that is not shown. The spindle unit 5 is equipped with a drive means 55 for moving the moving base plate 51 along the two guide rails 432a and 432a in the direction indicated by the arrow Z. Like the above-mentioned drive means 34 and 44, the drive means 55 includes an externally threaded rod (not shown) disposed between the guide rails 432a and 432a, and a drive source such as a pulse motor 552 for rotating the externally threaded rod. By driving the externally threaded rod (not shown) forward and reverse by the pulse motor 552, the spindle unit 5 can be moved along the guide rails 432a and 432a in the direction indicated by the arrow Z.

The illustrated dicing apparatus includes, as shown in FIG. 1, a cassette 12 for stocking the semiconductor wafers 11 that are the workpiece to be treated, a workpiece delivery means 13, a workpiece conveyer means 14, a washing means 15, a wash/convey means 16, and an aligning means 17 constituted by a microscope, a CCD camera or the like. The semiconductor wafer 11 is mounted on a frame 111 using a tape 112, and is accommodated in the cassette 12 in a state of being mounted on the frame 111. Further, the cassette 12 is placed on a cassette table 121 that is disposed so as to move up and down by an ascending/descending means that is not shown.

Next, the processing action of the above-mentioned dicing apparatus will be briefly described.

The semiconductor wafer 11 in a state mounted on the frame 111 accommodated at a predetermined position in the cassette 12 (hereinafter, the semiconductor wafer 11 of a state mounted on the frame 111 is simply referred to as semiconductor wafer 11), is brought to a delivery position as the cassette table 121 is moved up and down by the ascending/descending means that is not shown. Then, the workpiece delivery means 13 moves back and forth to deliver the semiconductor wafer 11 located at the delivery position to a workpiece-placing area 18. The semiconductor wafer 11 delivered to the workpiece-placing area 18 is conveyed onto the adsorption chuck 332 of the chuck table 33 constituting the above-mentioned chuck table mechanism 3 by the turning action of the workpiece conveyer means 14, and is sucked and held by the adsorption chuck 332. The chuck table 33 that has held the semiconductor wafer 11 by suction is then moved to just under the aligning means 17 along the guide rails 32 and 32. When the chuck table 33 is positioned just under the aligning means 17, a cutting line formed on the semiconductor wafer 11 is detected by the aligning means 17, and a precision positioning operation is executed. Thereafter, the chuck table 33 holding the semiconductor wafer 11 by suction is moved in the direction indicated by the arrow X which is the cut-feeding direction (direction at right angles to the rotary shaft of the cutting blade 54), whereby the semiconductor wafer 11 held by the chuck table 33 is cut along a predetermined cutting line by the cutting edge 542 of the cutting blade 54. That is, the cutting blade 54 is mounted on the spindle unit 5 that is positioned being moved and adjusted by its movement in the direction indicated by the arrow Y which is the indexing direction and in the direction indicated by the arrow Z which is the cutting-in direction, and is rotatively driven. By moving the chuck table 33 in the cut-feeding direction along the lower side of the cutting blade 54, therefore, the semiconductor wafer 11 held by the chuck table 33 is cut by the cutting edge 542 of the cutting blade 54 along the predetermined cutting line, and is divided into semiconductor chips. The semiconductor chips that have been cut do not scatter into pieces due to the action of the tape 112 but remain in the state of the semiconductor wafer 11 mounted on the frame 111. After the semiconductor wafer 11 is cut as described above, the chuck table 33 holding the semiconductor wafer 11 is returned back to the position where it has first held the semiconductor wafer 11 by suction and discontinues the holding of the semiconductor wafer 11 by suction. Then, the semiconductor wafer 11 is conveyed by the wash/convey means 16 to the washing means 15 and is washed. The thus washed semiconductor wafer 11 is delivered by the workpiece conveyer means 14 onto the workpiece-placing area 18. The semiconductor wafer 11 is then accommodated at a predetermined position in the cassette 12 by the workpiece delivery means 13.

Next, described below with reference to FIG. 3 is an embodiment (first invention) of the dicing method of cutting the semiconductor wafer by using the above-mentioned dicing apparatus.

Figure 3A:
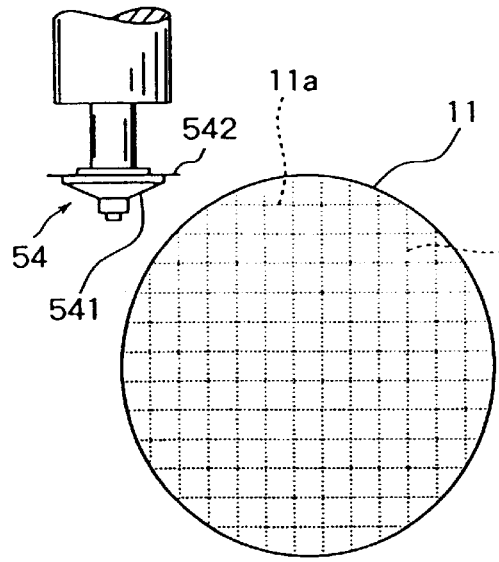
FIGS. 3(a)–3(d) are views illustrating the dicing method according to an embodiment of the present invention.
Figure 3B:
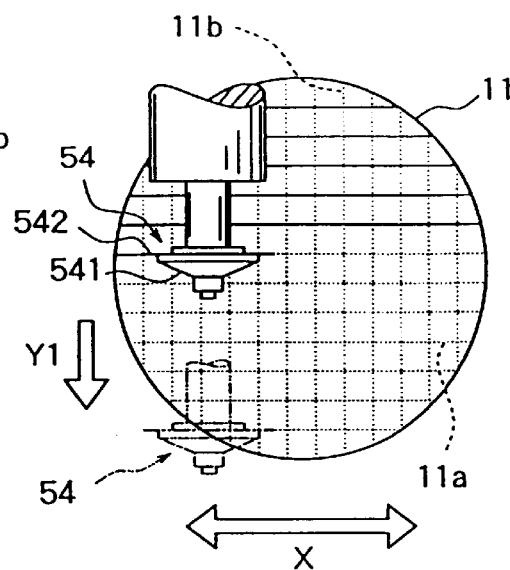
Figure 3C:
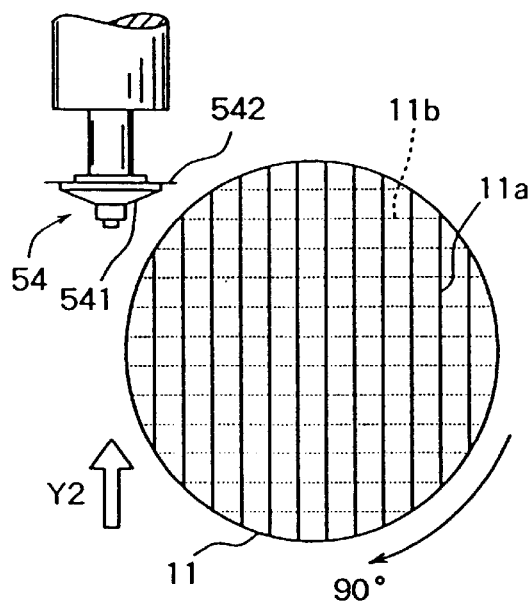
Figure 3D:
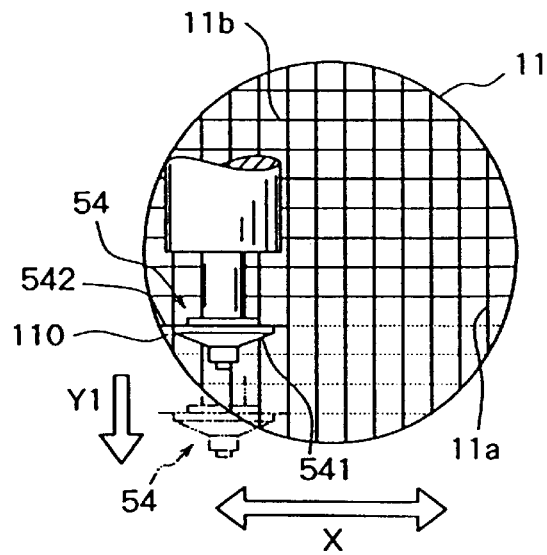
Figure 4A:
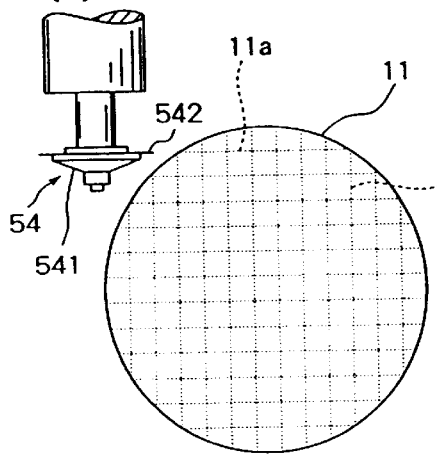
FIGS. 4(a)–4(f) are views illustrating the dicing method according to another embodiment of the present invention.
Figure 4B:
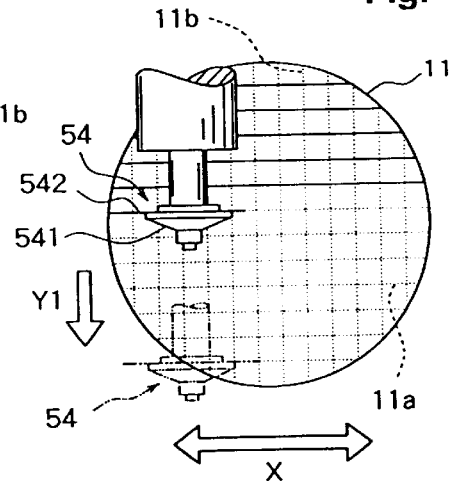
Figure 4C:
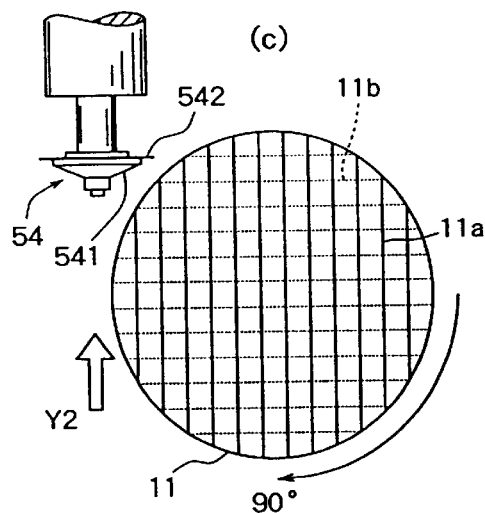
Figure 4D:
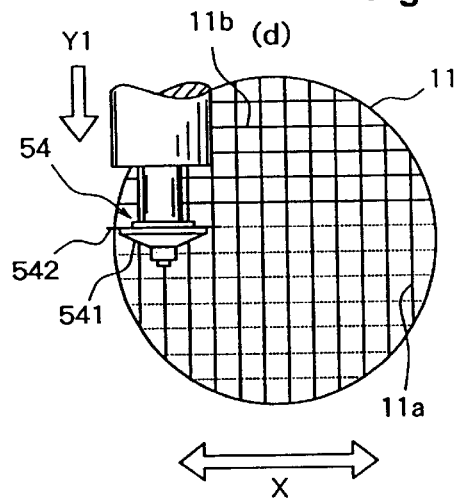
Figure 4E:
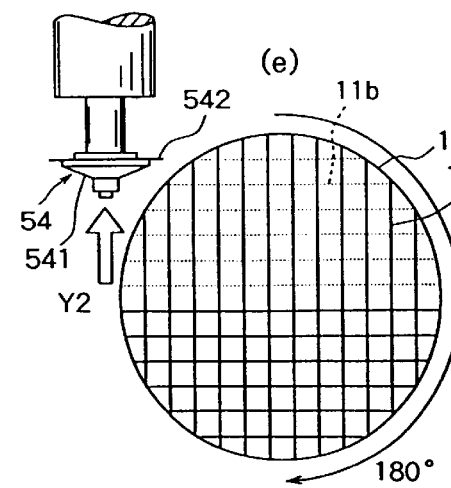
Figure 4F:
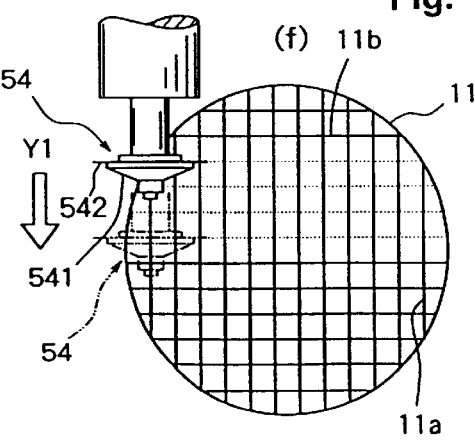

Referring to FIG. 3(a), the semiconductor wafer 11 is so positioned that the first streets 11a are in the cut-feeding direction (see FIG. 3(b)) indicated by the arrow X and that the cutting blade 54 is positioned at one side edge of the semiconductor wafer 11. In the illustrated embodiment, the cutting blade 54 is set so that the side of the base plate 541 is on the side of the unworked region of the semiconductor wafer 11 which is the workpiece, i.e., the cutting edge 542 is situated on the upstream side (upper side in FIG. 3) in the indexing direction indicated by the arrow Y1 (see FIG. 3(b)). Then, as shown in FIG. 3(b), plural first streets 11a are cut through the first cutting step in which the cut-feeding for moving the semiconductor wafer 11 and the cutting blade 54 correlative to each other in the cut-feeding direction indicated by X and the index-feeding for moving the cutting blade 54 in the indexing direction indicated by the arrow Y1 after one street is cut are sequentially and repeatedly executed. After the first cutting step has been finished, a rotational positioning step is executed to turn the semiconductor wafer 11 by 90 degrees as shown in FIG. 3(c) and to move the cutting blade 54 in the direction indicated by the arrow Y2 so as to be located at one side edge of the semiconductor wafer 11. At this moment, the side of the base plate 541 of the cutting blade 54 faces the unworked region of the semiconductor wafer 11 which is the workpiece. That is, the side of the cutting edge 542 locates on the upstream side (upper side in FIG. 3) in the indexing direction indicated by the arrow Y1. Referring to FIG. 3(d), plural second streets 11b are cut through the second cutting step in which the cut-feeding for moving the semiconductor wafer 11 and the cutting blade correlative to each other in the cut-feeding direction indicated by X and the index-feeding for moving the cutting blade 54 in the indexing direction indicated by the arrow Y1 after one street is cut are sequentially and repeatedly executed.

In the embodiment shown in FIG. 3 as described above, the cutting edge 542 of the cutting blade 54 in the second cutting step is positioned on the upstream side (upper side in FIG. 3) relative to the indexing direction indicated by the arrow Y1. Therefore, the pellets 110 formed by cutting are present on the upstream side (upper side in FIG. 3) in the indexing direction indicated by the arrow Y1, i.e., on the rear side of the cutting blade 54. Therefore, since no pellet is formed on the downstream side (lower side in FIG. 3) in the indexing direction indicated by the arrow Y1 of the cutting edge 542, i.e., no pellet is formed on the side of the base plate 541 and hence, no pellet 110 bites into between the base plate 541 and the cutting edge 542. Consequently, the cutting edge 542 can be prevented from being damaged. In the embodiment shown in FIG. 3, small triangular pellets 110 are formed on the outer periphery on the downstream side (lower side in FIG. 3) in the indexing direction indicated by the arrow Y1 of the cutting edge 542, i.e., on the side of the base plate 541 after the half region of the semiconductor wafer 11 has been cut through the second cutting step. Accordingly, these pellets 110 may bite into between the base plate 541 and the cutting edge 542 sometimes but their amount is smaller than that of the above-mentioned conventional dicing method.

Next, described below with reference to FIG. 4 is another embodiment (second invention) of the dicing method according to the present invention.

The steps (a), (b) and (c) of FIG. 4 are the same as the steps (a), (b) and (c) of FIG. 3. By executing the steps (a), (b) and (c) of FIG. 4, the first cutting step for cutting the first streets 11a and the first rotational positioning step for turning the semiconductor wafer 11 by 90 degrees and for moving the cutting blade 54 in the direction indicated by the arrow Y2 to position it at one side edge of the semiconductor wafer 11, are finished. In this case, the side of the base plate 541 of the cutting blade 54 faces the unworked region of the semiconductor wafer 11 which is the workpiece. That is, the cutting edge 542 of the cutting blade 54 is on the upstream side (upper side in FIG. 4) in the indexing direction indicated by the arrow Y1. Next, plural second streets 11b are cut through the second cutting step in that the half region from one side edge to the center of the semiconductor wafer 11 is cut by sequentially repeating, as shown in FIG. 4(d), the cut-feeding for moving the semiconductor wafer 11 and the cutting blade correlative to each other in the cut-feeding direction indicated by X and the index-feeding for moving the cutting blade 54 in the indexing direction indicated by the arrow Y1 after one street is cut. Referring to FIG. 4(e), a second rotational positioning step is then executed in which the semiconductor wafer 11 is turned by 180 degrees, and the cutting blade 54 is moved in the direction indicated by an arrow Y2 so that the side of the base plate 541 faces the unworked region of the semiconductor wafer 11 which is the workpiece, that is, the cutting edge 542 is positioned at the other side edge of the semiconductor wafer 11 to be located on the upstream side in the indexing direction. After the second rotational positioning step is finished, plural second streets 11b are cut by executing a third cutting step for cutting the remaining half region 11 from the other side edge to the center of the semiconductor wafer by sequentially repeating, as shown in FIG. 4(f), the cut-feeding for moving the semiconductor wafer 11 and the cutting blade correlative to each other in the cut-feeding direction indicated by X, and the index-feeding for moving the cutting blade 54 in the indexing direction indicated by the arrow Y1 after one street is cut.

In the embodiment shown in FIG. 4 as described above, the side of the base plate 541 of the cutting blade 54 faces the side of the unworked region of the semiconductor wafer 11 which is the workpiece, i.e., the cutting edge 542 faces the upstream side (upper side in FIG. 3) in the indexing direction indicated by the arrow Y1 in the second and third cutting steps for cutting the second streets 11b. Therefore, the pellets 110 are cut always on the upstream side (upper side in FIG. 3) in the indexing direction indicated by the arrow Y1 of the cutting edge 542, i.e., on the rear side. Accordingly, the pellets 110 are not cut on the downstream side (lower side in FIG. 3) in the indexing direction indicated by the arrow Y1 of the cutting edge 542, namely, are not cut on the side of the base plate 541. Hence, the pellets 110 do not bite into between the base plate 541 and the cutting edge 542, whereby the cutting edge 542 can be prevented from being damaged.

Figure 8:
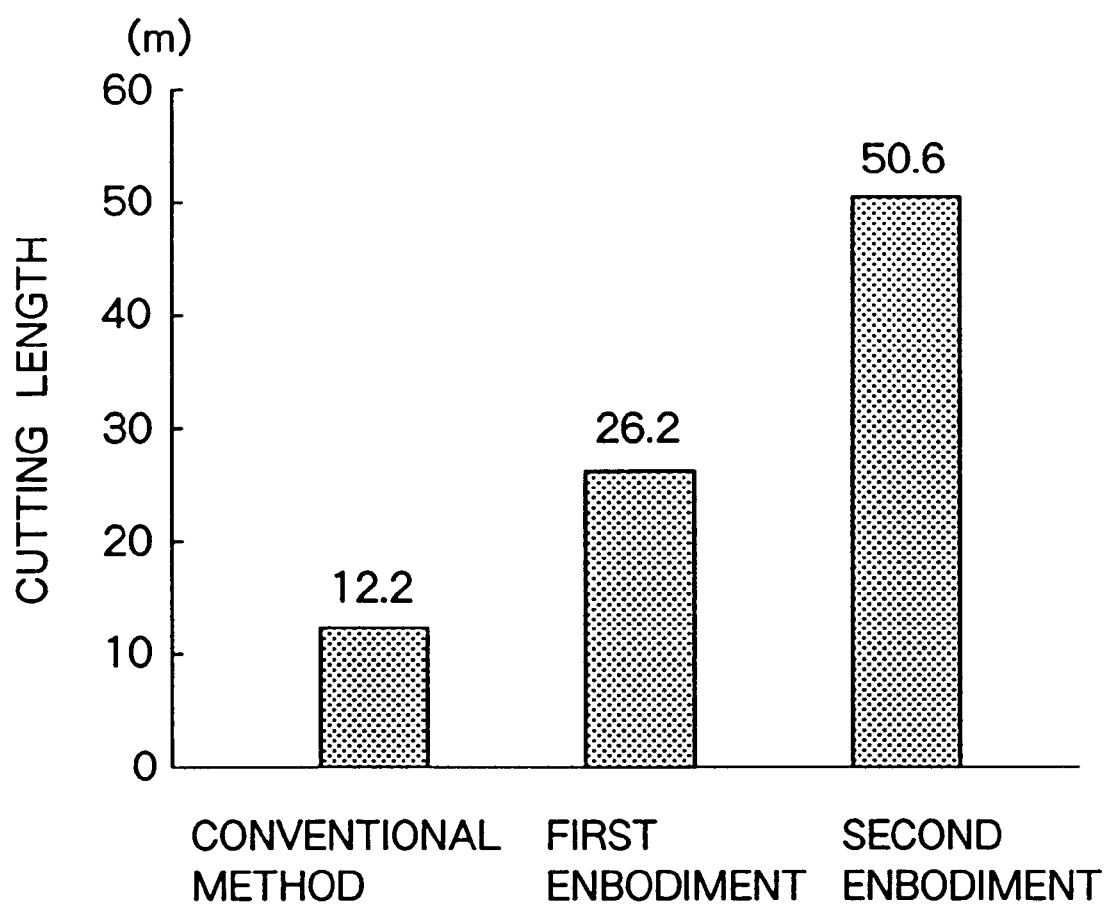
FIG. 8 is a graph showing lives until the cutting edges are damaged at the time when the semiconductor wafers are cut according to the conventional dicing method and according to the dicing method of the present invention.

FIG. 8 shows results of an experiment, executed by the present inventors, on service lives of the cutting edges of until they have been damaged in cutting the semiconductor wafers into square pellets having a size of 1 mm$_2$ according to each of the conventional dicing method shown in FIG. 7, the first invention shown in FIG. 3 and the second invention shown in FIG. 4.

As shown in FIG. 8, the length that was cut before the cutting edge was damaged was 12.2 meters according to the conventional dicing method, 26.2 meters according to the first invention method, and 51.6 meters according to the second invention method. As described above, the present invention makes it possible to lengthen the service life of the cutting edge to be not smaller than two times (first invention) and not smaller than four times (second invention) compared with the service life of the cutting edge of the conventional method.

Though the invention has been described by way of the illustrated embodiments, it should be noted that the invention is in no way limited thereto only. In the illustrated embodiments, the cutting blade 54 having a cutting edge 542 formed on one side of the base plate 541 was provided on the side of the spindle housing 53. It is, however, also possible to use a cutting blade having a cutting edge 542 formed on one side of the base plate 541 provided on the side opposite to the spindle housing 53, so that the base plate 541 faces the spindle housing 53. In this case, the index direction of the cutting blade accords with the direction indicated by the arrow Y2 in the step of cutting the second streets 11b in FIGS. 3 and 4. Further, in the illustrated embodiments, there has been dealt with the method of dicing the semiconductor wafer on which the first streets 11a and the second streets 11b were formed intersecting at right angles. However, it is of course that the present invention can also be applied to dicing the workpiece on which the first streets 1a and the second streets 11b intersect at any desired angle other than 90 degrees.

The dicing method of the present invention that is constituted as described above exhibits the action and effect as described below.

That is, according to the present invention, the cutting blade in the step of cutting the second streets is so positioned that the base plate of the cutting blade faces the side of the unworked region of the workpiece. Therefore, the pellets that are formed by dicing all exist on the upstream side in the indexing direction of the cutting edge. In other words, no pellet is formed on the side of the base plate of the cutting blade and hence, no pellet bites into between the base plate and the cutting edge. This, therefore, prevents the cutting edge from being damaged.

What is claimed is:

1. A dicing method of cutting a semiconductor wafer mounted on a frame via a tape and having plural first streets formed in parallel with each other and plural second streets formed in parallel with each other in a direction to intersect said first streets at a predetermined angle, along said first streets and said second streets by using a cutting blade having an annular cutting edge formed on the outer peripheral portion on one side surface of a base plate, wherein said dicing method comprises:

the first cutting step in which the plural first streets are cut by sequentially repeating the cut-feeding for positioning the semiconductor wafer so that the first streets are in the cut-feeding direction and for moving said semiconductor wafer and said cutting blade correlative to each other in the cut-feeding direction and the index-feeding for moving said semiconductor wafer and said cutting blade correlative to each other in an index direction at right angles to the cut-feeding direction to index the gap of said first streets;

the first rotational positioning step in which after said first cutting step has been finished, said semiconductor wafer is turned by a predetermined angle to be positioned so that said second streets are in the cut-feeding direction and said cutting blade is positioned at one side edge of said semiconductor wafer so that the base plate of said cutting blade faces the side of the unworked region of said semiconductor wafer;

the second cutting step in which after said first rotational positioning step has been finished, the plural second streets are cut over a half region from the one side edge toward the center of said semiconductor wafer by sequentially repeating the cut-feeding for moving said semiconductor wafer and said cutting blade correlative to each other in the cut-feeding direction and the index-feeding for moving said semiconductor wafer and said cutting blade correlative to each other in the index direction at right angles to the cut-feeding direction to index the gap of said second streets;

the second rotational positioning step in which after said second cutting step has been finished, said semiconductor wafer is turned by 180 degrees and said cutting blade is positioned at the other side edge of said semiconductor wafer so that the side of the base plate of said cutting blade faces the side of the unworked region of said semiconductor wafer; and the third cutting step in which after said second rotational positioning step has been finished, the plural second streets are cut over the remaining half region from the other side edge toward the center of said semiconductor wafer by sequentially repeating the cut-feeding for moving said semiconductor wafer and said cutting blade correlative to each other in the cut-feeding direction and the index feeding for moving said semiconductor wafer and said cutting blade correlative to each other in the index direction at right angles to the cut-feeding direction to index the gap of said second streets.

* * * * *